United States Patent
Choi et al.

(10) Patent No.: US 8,716,058 B2
(45) Date of Patent: May 6, 2014

(54) ORGANIC LIGHT-EMITTING DISPLAY DEVICE AND METHOD OF MANUFACTURING THE SAME

(71) Applicants: Jong-Hyun Choi, Yongin-si (KR);
Jong-Yun Kim, Yongin-si (KR);
Jin-Goo Kang, Yongin-si (KR);
Dae-Hyun Noh, Yongin-si (KR)

(72) Inventors: Jong-Hyun Choi, Yongin-si (KR);
Jong-Yun Kim, Yongin-si (KR);
Jin-Goo Kang, Yongin-si (KR);
Dae-Hyun Noh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/928,120

(22) Filed: Jun. 26, 2013

(65) Prior Publication Data

US 2013/0288413 A1 Oct. 31, 2013

Related U.S. Application Data

(62) Division of application No. 13/098,271, filed on Apr. 29, 2011, now Pat. No. 8,487,301.

(30) Foreign Application Priority Data

Jul. 7, 2010 (KR) .................. 10-2010-0065457

(51) Int. Cl.
*H01L 51/54* (2006.01)
*H01L 51/56* (2006.01)
*H01L 27/32* (2006.01)

(52) U.S. Cl.
USPC .............. 438/99; 438/22; 438/745; 257/40; 257/E51.019

(58) Field of Classification Search
None
See application file for complete search history.

(56) References Cited

U.S. PATENT DOCUMENTS

2003/0006697 A1* 1/2003 Weaver .................. 313/503
2007/0247066 A1 10/2007 Tokairin et al.

(Continued)

FOREIGN PATENT DOCUMENTS

JP 2001-148289 5/2001
JP 2007-227289 9/2007

(Continued)

OTHER PUBLICATIONS

Kim, H.D., Current Status of OLED Color Patterning Technology, Samsung SDI, Jul. 7, 2006.

(Continued)

*Primary Examiner* — Thomas L Dickey
*Assistant Examiner* — Joseph Schoenholtz
(74) *Attorney, Agent, or Firm* — Christie, Parker & Hale, LLP

(57) ABSTRACT

An organic light-emitting display device including a substrate; at least one thin-film transistor (TFT) formed on the substrate; a planarizing layer covering the TFT; a pixel electrode, which is formed on the planarizing layer and is connected to the TFT; a protective layer surrounding an edge of the pixel electrode; a pixel defining layer (PDL), which has an overhang (OH) structure protruding more than the top surface of the protective layer, covers the protective layer and the edge of the pixel electrode, and exposes a portion of the pixel electrode surrounded by the protective layer; a counter electrode facing the pixel electrode; and an intermediate layer, which is interposed between the pixel electrode and the counter electrode and includes a light-emitting layer and at least one organic layer, where the thickness of the intermediate layer is greater than the thickness of the protective layer.

14 Claims, 8 Drawing Sheets

(56) References Cited

U.S. PATENT DOCUMENTS

| | | | |
|---|---|---|---|
| 2008/0231168 A1* | 9/2008 | Choi | 313/500 |
| 2010/0035378 A1* | 2/2010 | Chang | 438/104 |
| 2010/0045173 A1* | 2/2010 | Kwon et al. | 313/504 |

FOREIGN PATENT DOCUMENTS

| | | | |
|---|---|---|---|
| KR | 10-2002-0022288 A | 3/2002 | |
| KR | 10-2003-0065347 A | 8/2003 | |
| KR | 10-2006-0027743 A | 3/2006 | |
| KR | 10-2007-0079303 A | 8/2007 | |
| KR | 10-2008-0037841 | 5/2008 | |
| KR | 10-2008-0109383 | 12/2008 | |
| KR | 10-2008-0113782 | 12/2008 | |
| KR | 10-2010-0022406 | 3/2010 | |
| WO | WO 2005/101915 A1 | 10/2005 | |

OTHER PUBLICATIONS

KIPO Registration Determination Certificate dated Sep. 4, 2012, for Korean priority Patent application 10-2010-0065457, (5 pages).

Office action issued on Feb. 27, 2012 in corresponding Korean Patent Application No. 10-2010-0065457; 4pp.

Takabatake, Masaru. "Indium Tin Oxide Dry Etching Using HBr Gas for Thin-Film Transistor Liquid Crystal Displays." Journal of the Electrochemical Society 142.7 (1995): 2470.

Zhang, Minlu, Organic Optoelectronic Devices: Organic Light-Emitting Diodes (OLED), 2006. Downloaded from URL < http://www.ece.rochester.edu/courses/ECE423/ECE223_423_MSC426%20Workshop06/term%papers%2006/MZhang.pdf> on Oct. 1, 2012.

* cited by examiner

ORGANIC LIGHT-EMITTING DISPLAY DEVICE AND METHOD OF MANUFACTURING THE SAME

CROSS-REFERENCE TO RELATED PATENT APPLICATIONS

This application is a divisional of U.S. patent application Ser. No. 13/098,271, filed Apr. 29, 2011, which claims priority to and the benefit of Korean Patent Application No. 10-2010-0065457, filed Jul. 7, 2010, the entire contents of both of which are incorporated herein by reference.

BACKGROUND

1. Field

The following description relates to an organic light-emitting display device and a method of manufacturing the same, and more particularly, to an organic light-emitting display device including an organic layer, which is formed by ejecting liquid organic material through, e.g., nozzle printing or inkjet printing, and a method of manufacturing the organic light-emitting display device.

2. Description of the Related Art

An organic light-emitting display device is a self-light-emitting type display device, in which, as a voltage is applied to a thin-film layer including a positive electrode, a negative electrode, and an organic light-emitting layer arranged between the positive and negative electrodes, electrons and holes are recombined in the organic light-emitting layer and light is emitted therefrom.

Here, an intermediate layer including an organic light-emitting layer may be formed using various suitable methods, such as vacuum deposition, laser induced thermal imaging (LITI), nozzle printing, inkjet printing, etc.

Nozzle printing or inkjet printing is a method of forming a desired pattern by ejecting liquid organic material onto a substrate, and thus an intermediate layer including an organic light-emitting layer may be formed at room temperature with relative ease and at inexpensive economic cost.

However, when an intermediate layer is formed by ejecting liquid organic material through, e.g., the nozzle printing or the inkjet printing, the planarity of a bottom substrate on which the intermediate layer is to be formed becomes an important factor. Furthermore, due to surface tension of the liquid organic material, boundaries of the liquid organic material are rounded. Therefore, it is difficult to planarize an intermediate layer.

SUMMARY

An aspect of an embodiment of the present invention is directed toward an organic light-emitting display device including an organic layer, which is formed by ejecting liquid organic material through, e.g., nozzle printing or inkjet printing, where planarities of a bottom substrate and the liquid organic material are improved, and a method of manufacturing the organic light-emitting display device.

According to an embodiment of the present invention, there is provided an organic light-emitting display device including a substrate; at least one thin-film transistor (TFT) formed on the substrate; a planarizing layer covering the TFT; a pixel electrode, which is formed on the planarizing layer and is electrically coupled to the TFT; a protective layer surrounding an edge of the pixel electrode; a pixel defining layer (PDL), which has an overhang (OH) structure protruding more than the top surface of the protective layer, covers the protective layer and the edge of the pixel electrode, and exposes a portion of the pixel electrode surrounded by the protective layer; a counter electrode facing the pixel electrode; and an intermediate layer, which is interposed between the pixel electrode and the counter electrode and includes a light-emitting layer and at least one organic layer, where the thickness of the intermediate layer is greater than the thickness of the protective layer.

The OH structure of the PDL may protrude to be at or between 0.2 μm and 5 μm from an edge of the protective layer.

The thickness of the protective layer may be at or between 100 Å and 1000 Å.

The PDL may include an inorganic insulation layer.

The protective layer may include a metal having higher etching selectivity than the pixel electrode.

The pixel electrode and the protective layer may include transparent conductive oxides (TCOs).

Each of the pixel electrode and the protective layer may include poly indium-tin-oxide (poly ITO), amorphous ITO (a-ITO), indium gallium oxide (IGO), or aluminum zinc oxide (AZO), the etching selectivities of which increase in the order stated, and the protective layer may include a material having higher etching selectivity than the pixel electrode.

The organic layer may be formed between the light-emitting layer and the pixel electrode, and the overall thickness of the organic layer may be identical to or greater than the thickness of the protective layer.

According to another embodiment of the present invention, there is provided a method of manufacturing an organic light-emitting display device, the method including (a) providing a substrate having at least one thin-film transistor (TFT); (b) sequentially forming a pixel electrode electrically coupling the TFT and a protective layer on the substrate; (c) forming a pixel defining layer (PDL) to surround an edge of the protective layer and to expose the protective layer inside the edges by forming an insulation layer to cover the pixel electrode and the protective layer and patterning the insulation layer; (d) etching the protective layer to expose a portion of the pixel electrode, so that an overhang structure, in which the PDL protrudes more than the top surface of the protective layer, is formed; (e) forming an intermediate layer by ejecting a light-emitting layer and at least one organic layer as liquid onto the exposed pixel electrode.

In operation (b), the thickness of the protective layer may be at or between 100 Å and 1000 Å.

The protective layer may include a metal having higher etching selectivity than the pixel electrode.

The pixel electrode and the protective layer may include transparent conductive oxides (TCOs).

Each of the pixel electrode and the protective layer may include poly indium-tin-oxide (poly ITO), amorphous ITO (a-ITO), indium gallium oxide (IGO), or aluminum zinc oxide (AZO), the etching selectivities of which may increase in the order stated, and the protective layer may include a material having higher etching selectivity than the pixel electrode.

In operation (c), the PDL may include an inorganic insulation layer.

The PDL may be formed through dry-etching.

The PDL may be etched by using plasma.

In operation (d), the protective layer may be formed through wet-etching.

In operation (d), the protective layer may be etched, such that the OH structure of the PDL protrudes to be at or between 0.2 μm and 5 μm from an edge of the protective layer.

In operation (e), the overall thickness of the intermediate layer may be greater than the thickness of the protective layer.

In operation (e), at least one organic layer may be formed between the light-emitting layer and the pixel electrode, and the overall thickness of the organic layer may be identical to or greater than the thickness of the protective layer.

In operation (e), the intermediate layer may be formed through inkjet printing or nozzle printing.

The method may further include forming a counter electrode, which may be a common electrode, on the intermediate layer after operation (e).

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
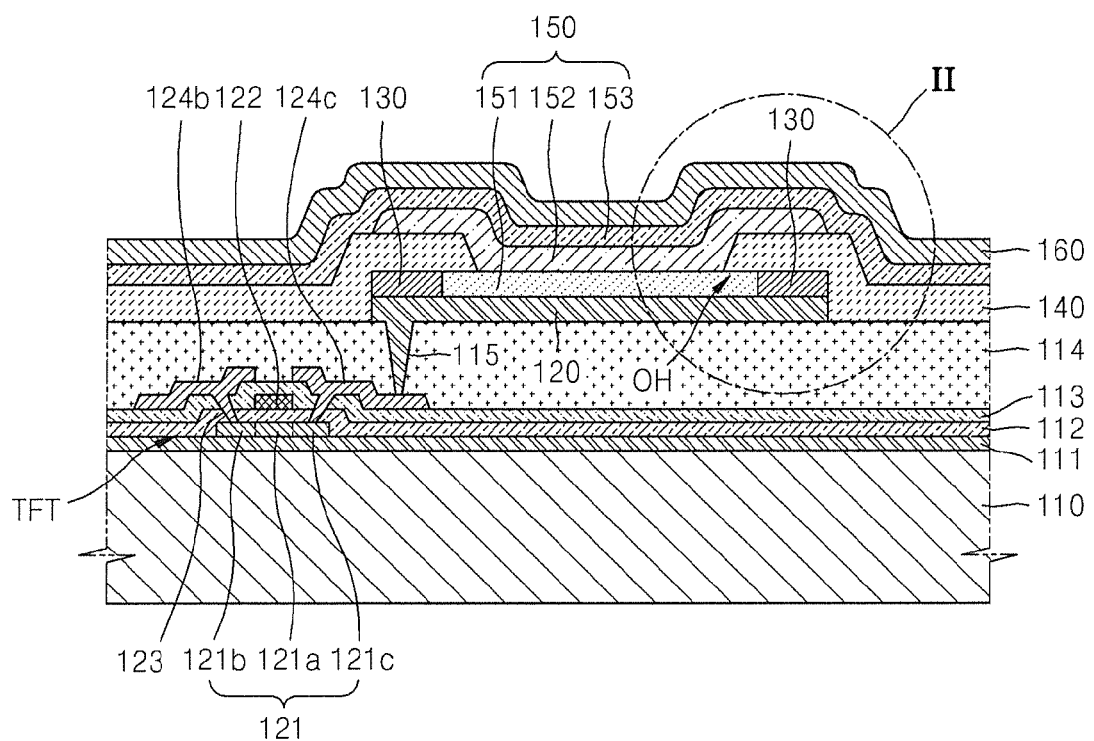
FIG. 1 is a sectional view of an organic light-emitting display device according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" an other element, it can be directly on the other element or be indirectly on the other element with one or more intervening elements interposed therebetween. Like reference numerals designate like elements throughout the specification.

Figure 2:
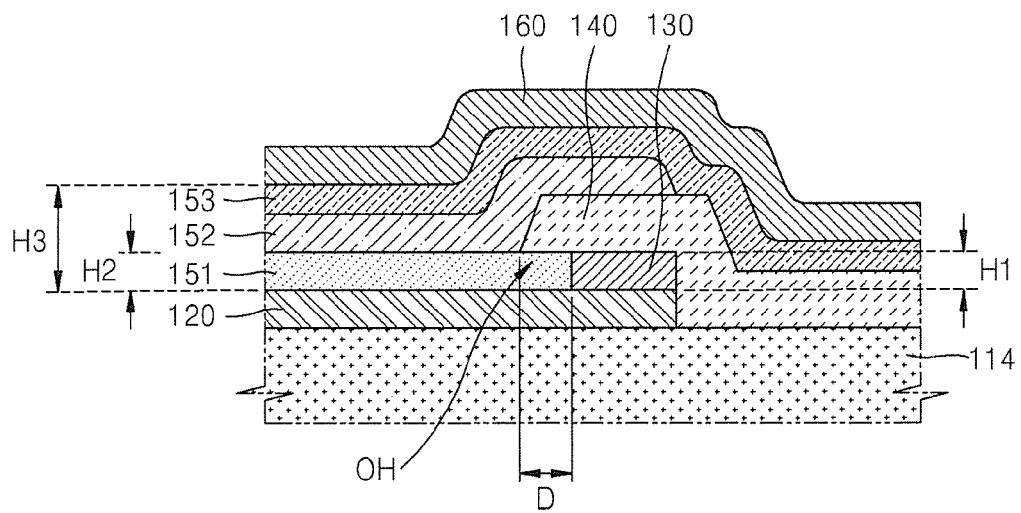
FIG. 2 is a sectional view showing portion II of FIG. 1 in closer detail.

FIG. 1 is a sectional view of an organic light-emitting display device according to an embodiment of the present invention. FIG. 2 is a sectional view showing portion II of FIG. 1 in closer detail. FIGS. 3 through 12 are sectional views showing a method of manufacturing the organic light-emitting display device of FIG. 1 pursuant to an embodiment of the present invention.

Referring to FIGS. 1 and 2, the organic light-emitting display device according to the present embodiment includes an intermediate layer 150 having a pixel electrode 120, which is connected to a thin-film transistor (TFT) formed on a substrate 110, a counter electrode 160, and an organic light-emitting layer 152 interposed between the pixel electrode 120 and the counter electrode 160. A protective layer 130 is formed around or to surround an edge (or each of the edges) of the pixel electrode 120, and a pixel defining layer (PDL) 140 is disposed to cover the protective layer 130 and the edges of the pixel electrode 120.

Figure 3:
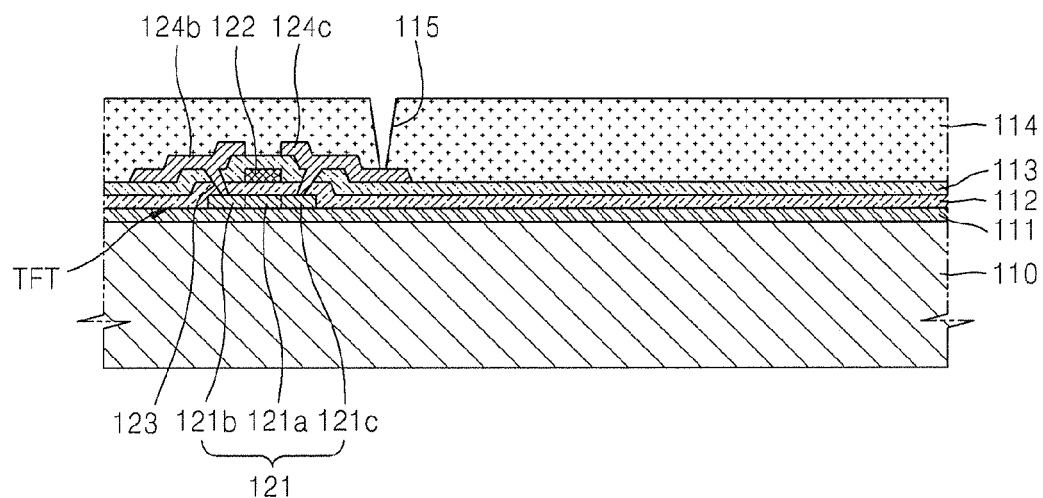
FIGS. 3 through 12 are sectional views showing a method of manufacturing the organic light-emitting display device of FIG. 1 pursuant to an embodiment of the present invention.

Referring to FIG. 3, at least one TFT is formed on the substrate 110, a planarizing layer 114 is formed on the substrate 110 to cover the TFT, and a via hole 115 is formed in the planarizing layer 114.

The substrate 110 may be formed of a $SiO_2$-based transparent glass material. However, if the organic light-emitting display device is a top emission type, in which an image is embodied from the substrate 110 toward the counter electrode 160, the substrate 110 may be formed of an opaque material.

A buffer layer 111, which is formed of $SiO_2$ and/or $SiN_x$ (where x can be any suitable number) may further be arranged on the top surface of the substrate 110 to planarize the top surface of the substrate 110 and to prevent or block permeation of impurities.

An active layer 121 of the TFT is formed on the buffer layer 111 by using a semiconductor material, and a gate insulation layer 112 is formed to cover the active layer 121. The active layer 121 may be formed of an inorganic semiconductor, such as amorphous silicon or poly-silicon, or an organic semiconductor, and includes a source region 121b, a drain region 121c, and a channel region 121a between the source region 121b and the drain region 121c.

A gate electrode 122 is formed on the gate insulation layer 112, and an interlayer insulation layer 113 is formed to cover the gate electrode 122. Furthermore, a source electrode 124b and a drain electrode 124c on the interlayer insulation layer 113 contact the source region 121b and the drain region 121c, respectively, via contact holes 123.

The planarizing layer 114 is formed on the interlayer insulation layer 113 to cover the source electrode 124b and the drain electrode 124c. The planarizing layer 114 is formed to planarize the top surface of the substrate 110 on which a plurality of TFTs are formed, and may contain one or more materials selected from a group consisting of polyimide, polyamide, acrylic resins, benzocyclobutene, and phenol resins.

The gate insulation layer 112, the interlayer insulation layer 113, and the planarizing layer 114 may be formed of insulation materials, and may be formed to have a single-layer structure or multi-layer structure of inorganic materials, organic materials, or organic/inorganic composite materials. The stack structure of the TFT described above is merely an example, and a TFT having any of various suitable structures may be applied to the present invention.

Figure 4:
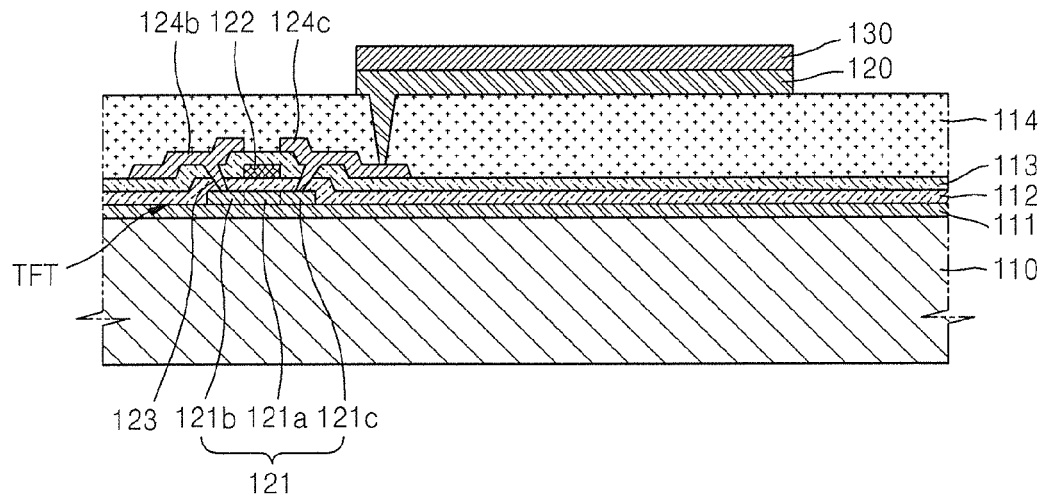

Referring to FIG. 4, the pixel electrode 120 and a protective layer 130 are sequentially stacked on the planarizing layer 114 in the order stated and are patterned, wherein the pixel electrode 120 is connected to either the source electrode 124b or the drain electrode 124c of the TFT via a via hole 115.

The pixel electrode 120 and the protective layer 130 may be simultaneously patterned using a method, such as photolithography, after a first metal layer and a second metal layer are sequentially deposited. Here, the protective layer 130 is formed of a material having a higher etching selectivity than a material constituting the pixel electrode 120. A detailed description thereof will be given below.

The protective layer 130 may be formed to have a thickness at or between 100 Å and 1000 Å. As described below and in one embodiment, if the thickness of the protective layer 130 is smaller than 100 Å, a space formed by the overhang (OH) structure of the protective layer 130 and the PDL 140 becomes small, and thus a space in which a material constituting the intermediate layer 150 is to be diffused is reduced. On the contrary and in another embodiment, if the thickness of the protective layer 130 is greater than 1000 Å, step coverage of the PDL 140, which covers the protective layer 130 and the edges of the pixel electrode, 120 becomes unstable.

Figure 5:
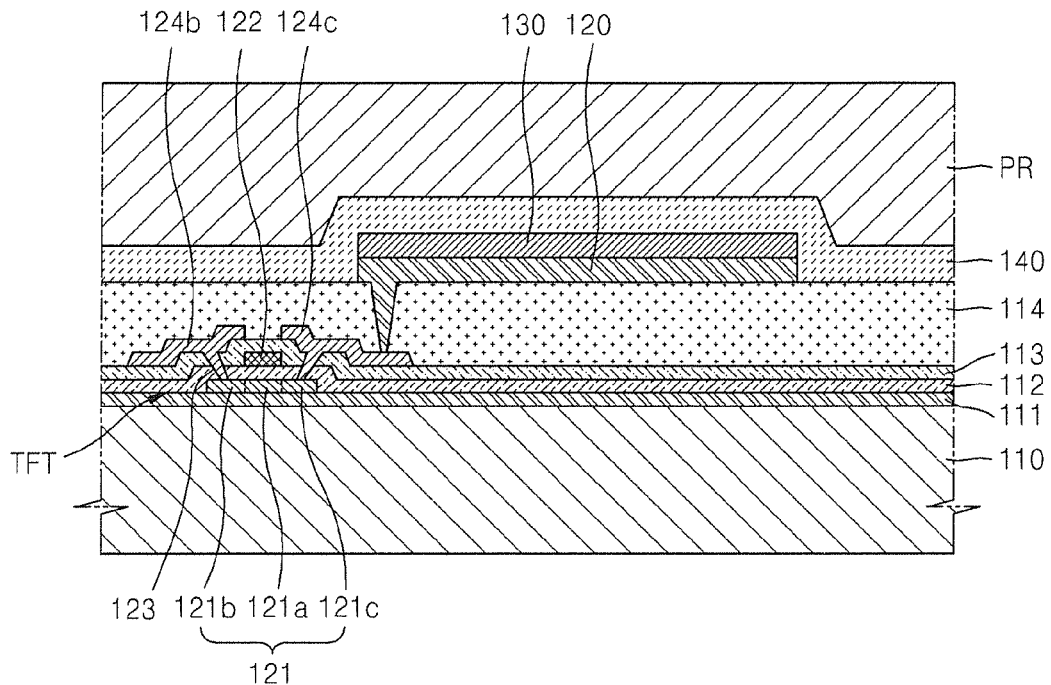

Referring to FIG. 5, raw material of the PDL 140 is formed on the planarizing layer 114 to cover the pixel electrode 120 and the protective layer 130, and photoresist (PR) is applied onto the raw material of the PDL 140.

In forming the intermediate layer 150 including the light-emitting layer 152, which is described below, by ejecting liquid material through nozzle printing or inkjet printing, the planarity of a bottom substrate on which the intermediate layer 150 is to be formed is an important factor. Here, in the case of forming the PDL 140 of an organic insulation layer, it is difficult to form the PDL 140 with a uniform and small thickness. Therefore, in the present embodiment, the PDL 140 is formed of an inorganic insulation layer.

In the case where the PDL 140 is formed of an inorganic insulation layer as described above, the inorganic insulation layer may be deposited in a vacuum. At this point, the protective layer 130 covering the pixel electrode 120 may protect the pixel electrode 120 while the inorganic insulation layer is being deposited.

Figure 6:
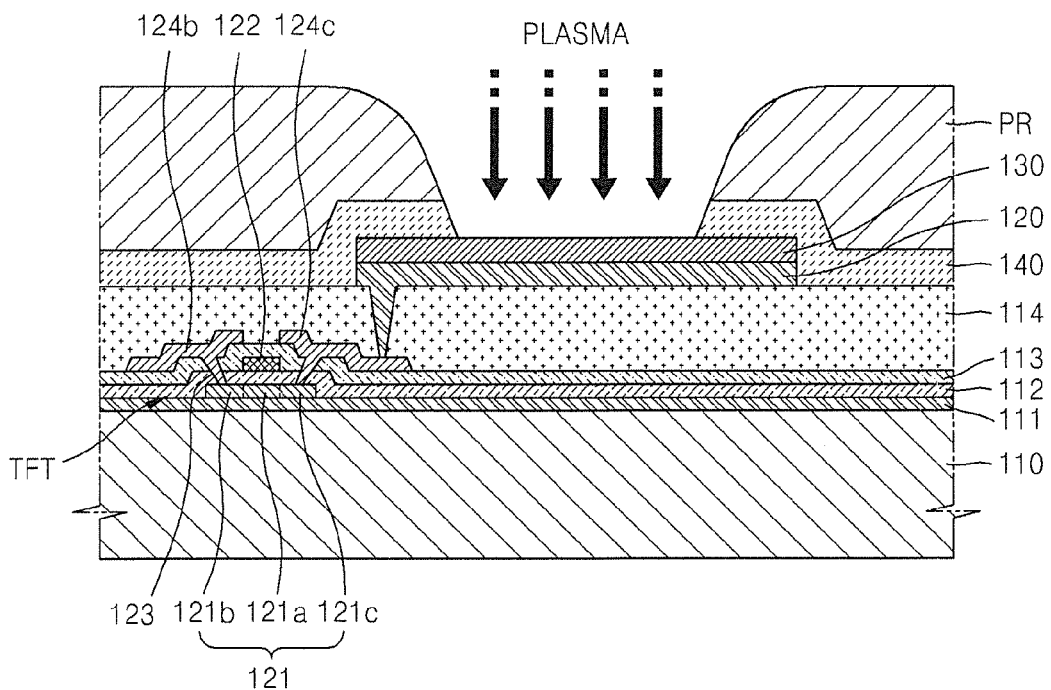

Referring to FIG. 6, the PDL 140 is patterned by dry-etching the PDL 140 using plasma, so that the PDL 140 covers the edge (or each of the edges) of the pixel electrode 120 and the edge (or each of the edges) of the protective layer 130.

Also, a photoresist (PR) is exposed to light, developed, and is patterned as an etching mask for the PDL 140, as shown in FIG. 6.

By using the PR as an etching mask, the PDL 140 is patterned to a desired pattern by dry-etching the PDL 140 using plasma. At this point, if the protective layer 130 is not formed on top of the pixel electrode 120, the pixel electrode 120 may be directly exposed to plasma and damaged. However, in the present embodiment, the protective layer 130, which is formed on top of the pixel electrode 120, protects the pixel electrode 120 from the plasma, and thus deterioration of the pixel electrode 120 may be prevented.

The PDL 140 formed as described above prevents (or protects against) concentration of an electric field on the edges of the pixel electrode 120 by increasing the distance between the edges of the pixel electrode 120 and the counter electrode 160, which is described below. As a result, the PDL 140 prevents (or protects against) a short circuit between the pixel electrode 120 and the counter electrode 160 and defines light-emitting regions of pixels.

Figure 7:
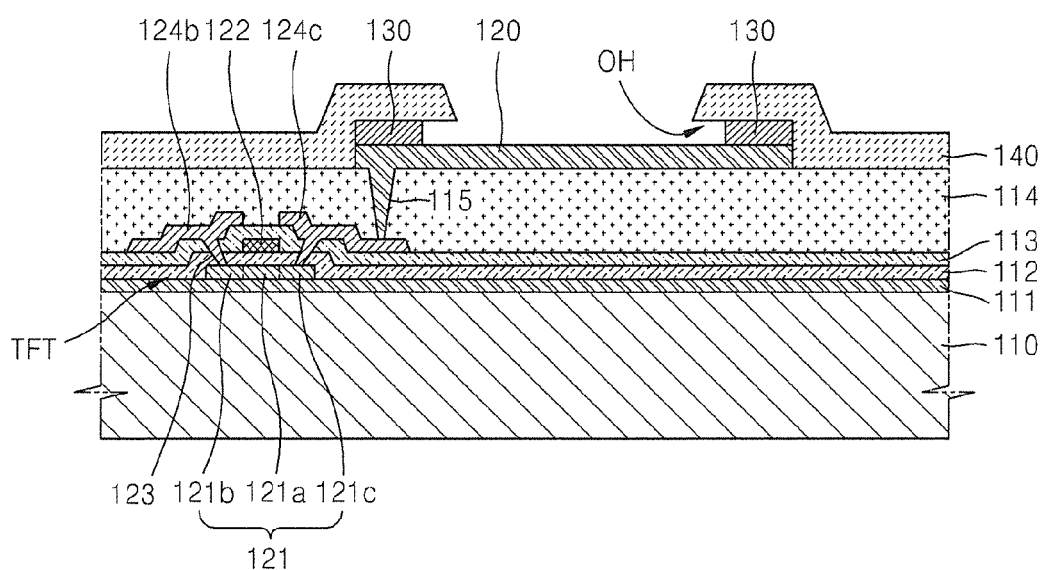

Referring to FIG. 7, the protective layer 130, which covers the entire top surface of the pixel electrode 120, is partially etched, and thus the protective layer 130 is formed to expose the top surface of the pixel electrode 120 except the edges of the top surface of the pixel electrode 120. Especially, the protective layer 130 is etched, so that an overhang (OH) structure, in which the PDL 140 protrudes more than the top surface of the etched protective layer 130, is formed.

To form the OH structure, the protective layer 130 is wet-etched. At this point, the protective layer 130 contains a metal having higher etching selectivity than the pixel electrode 120.

In the present embodiment, the pixel electrode 120 may be formed of a transparent conductive oxide (TCO). From among TCOs, etching selectivities of poly indium-tin-oxide (poly ITO), amorphous ITO (a-ITO), indium gallium oxide (IGO), and aluminum zinc oxide (AZO) increase in the order they were mentioned above. Therefore, in the case of using poly ITO as the pixel electrode 120, the protective layer 130 may be formed of the a-ITO, IGO, or AZO, which has higher etching selectivity than the poly ITO.

At this point, the protective layer 130 is etched, such that the OH structure of the PDL 140 protrudes to be at or between 0.2 μm and 5 μm from the edge (or each of the edges) of the protective layer 130. As described below and in one embodiment, if the protruding distance D of the OH structure is smaller than 0.2 μm, a space formed by the OH structure of the protective layer 130 and the PDL 140 becomes small, and thus a space in which a material constituting the intermediate layer 150 is to be diffused is reduced. On the other hand and in another embodiment, if the protruding distance D of the OH structure is greater than 5 μm, it is difficult to maintain the OH structure due to its weight.

The light-emitting layer 152 may be formed of a monomer organic material or a polymer organic material.

In case of using a monomer organic material, a hold injection layer (HIL), a hole transport layer (HTL), an electron transport layer (ETL), and an electron injection layer (EIL) may be stacked in a single structure or a composite structure with respect to the light-emitting layer 152. Any of various suitable organic materials including copper phthalocyanine (CuPc), N, N-di(naphthalene-1-yl)-N, N'-diphenyl-benzidine (NPB), tris-8-hyroxyquinoline aluminum (Alq3), or the like may be used.

In case of using a polymer organic material, the light-emitting layer 152 may further include an HTL toward an anode electrode. Here, the HTL may be formed of PEDOT, whereas the light-emitting layer 152 may be formed of a poly-phenylenvinylene (PPV)-based polymer organic material or a polyfluorene-based polymer organic material.

Figure 8:
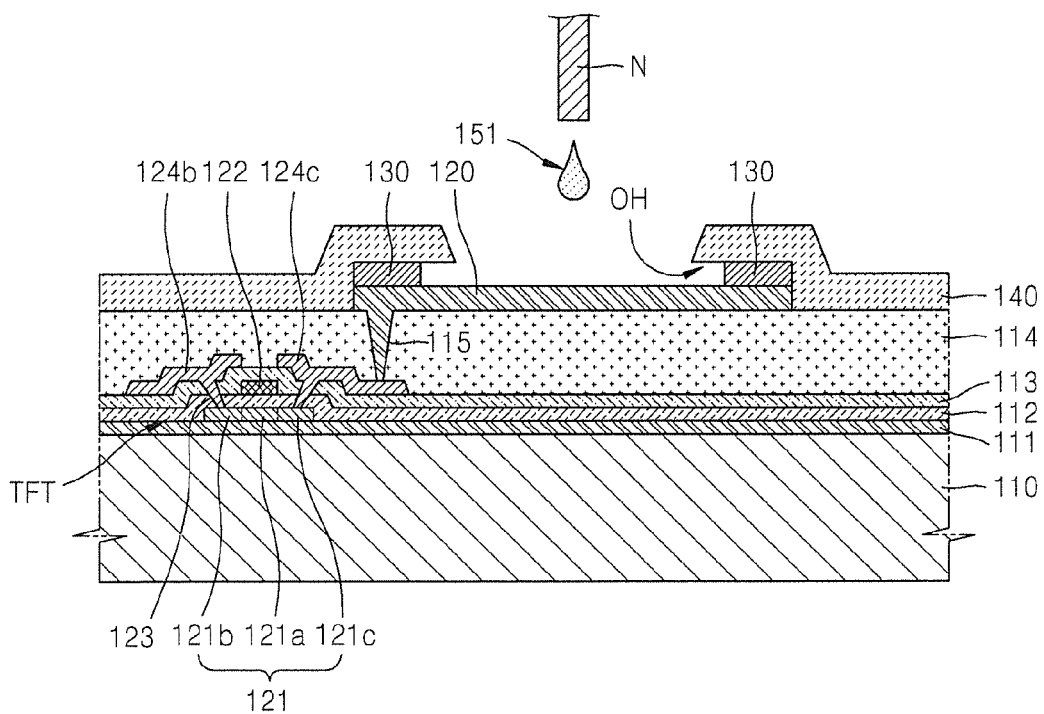
Figure 9:
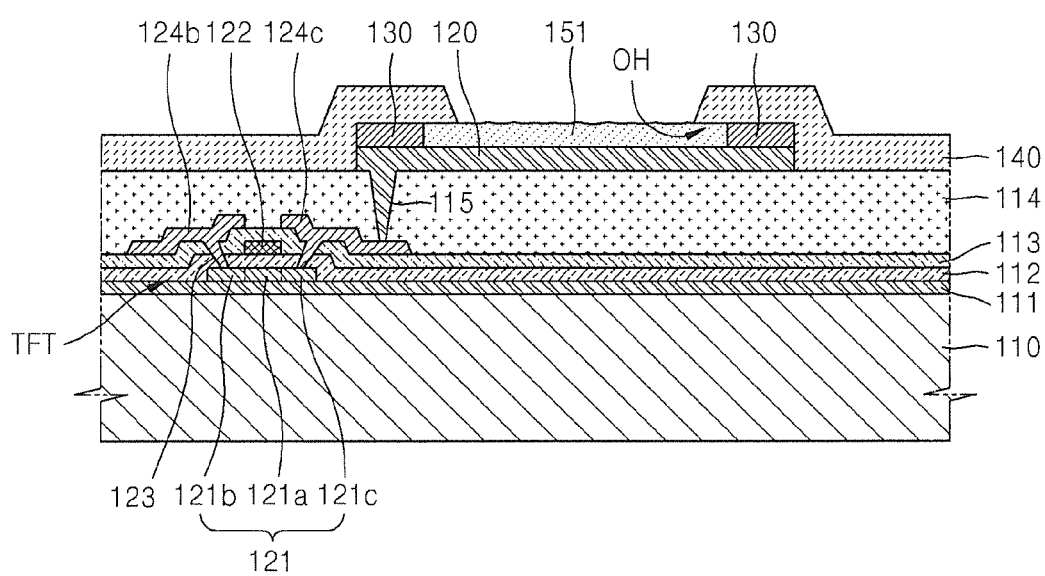
Figure 10A:
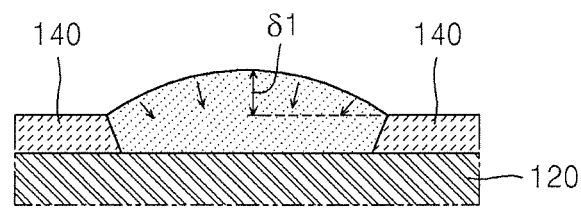
Figure 10B:
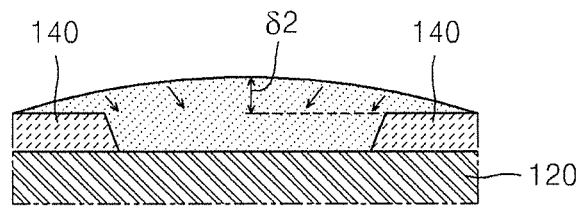
Figure 10C:
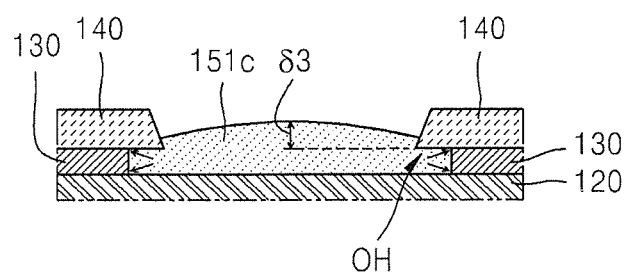
Figure 11:
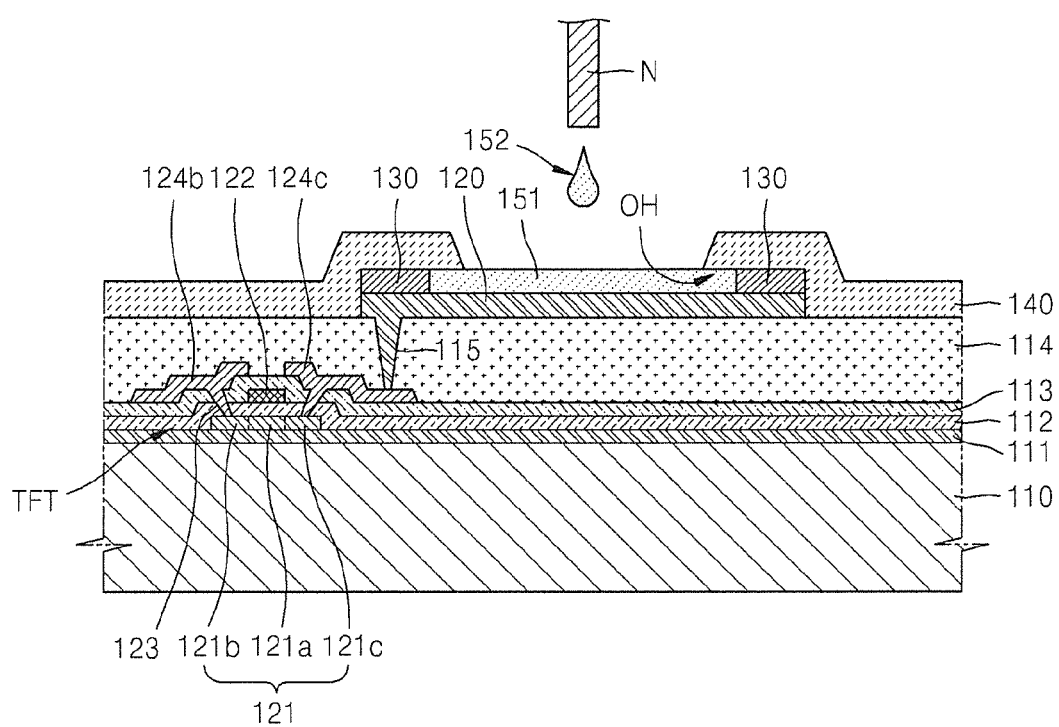
Figure 12:
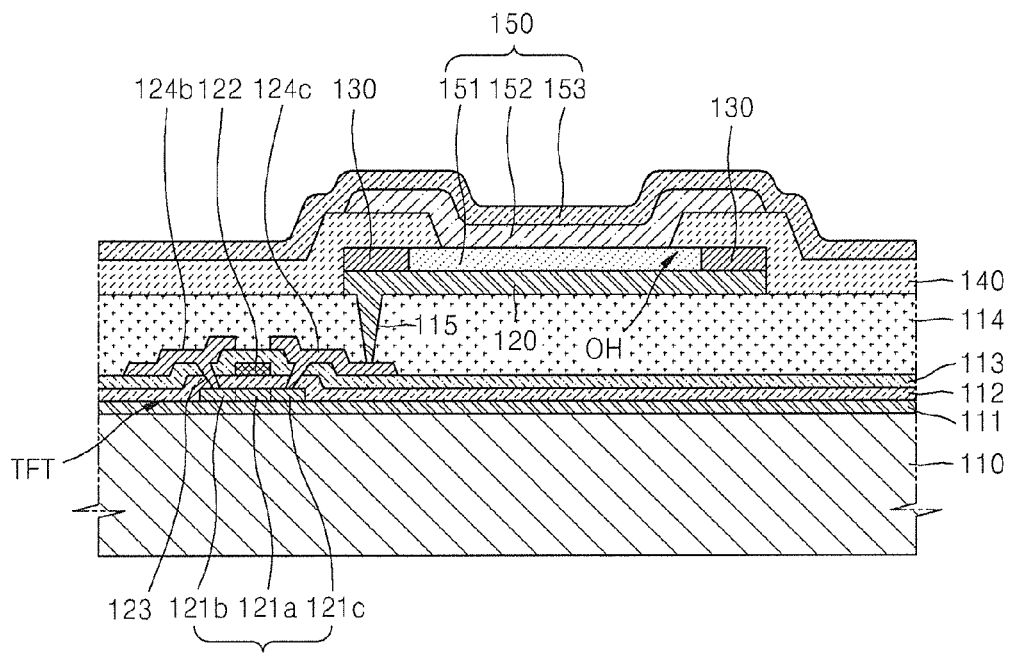

FIGS. 8, 9, 10, and 11 show a case where the light emitting layer is formed of a monomer organic material. Here, FIG. 8 shows that liquid material of an organic layer 151 corresponding to an HIL and an HTL (that are configured to inject and transport holes) is ejected onto the pixel electrode 120 via a nozzle N, FIG. 9 shows that the organic layer 151 is formed on the pixel electrode 120, FIG. 11 shows that the monomer organic light-emitting layer 152 is ejected onto the pixel electrode 120 via the nozzle N, and FIG. 12 shows that an organic layer 153 corresponding to an ETL and an EIL is formed on the light-emitting layer 152.

It is clear that, if the light-emitting layer 152 is formed of a polymer organic material, it may be understood that FIG. 8 depicts liquid ejection of the organic layer 151 corresponding to an HTL, which transports holes, and FIG. 11 depicts liquid ejection of the polymer organic light-emitting layer 152. Here, in one embodiment, no other organic layer is interposed between the counter electrode 160 (which is a cathode) and the light-emitting layer 152.

Referring to FIG. 9, the ejected liquid organic layer 151 forms a pattern of the organic layer 151 on the pixel electrode 120. For example, the organic layer 151 may be an HIL and an HTL.

The light-emitting layer 152 is formed on the organic layer 151 formed as described above, where, if the top surface of the organic layer 151 formed between the pixel electrode 120 and the light-emitting layer 152 is not planarized, the light-emitting layer 152 formed thereon is also not planarized. If planarity of the light-emitting layer 152 is not guaranteed, reliability of display quality may not be guaranteed.

However, as described above, in the organic light-emitting display device according to the present embodiment, the etched protective layer 130 is formed on the edges of the pixel electrode 120, and an OH structure, in which the PDL 140 protrudes more than the top surface of the etched protective layer 130, is formed, and thus planarity of the organic layer 151 may be improved.

As shown in FIG. 10A, in a comparable organic light-emitting display device, in which only the PDL 140 is formed on the edges of the pixel electrode 120, the boundaries of liquid organic material contacting the air are round due to the surface tension of the liquid organic material. Therefore, a light-emitting layer cannot be formed flat. As shown in FIG. 10B, although planarity of the top surface of an organic layer may be improved by increasing the amount of liquid organic material to be ejected ($\delta 1 > \delta 2$), dissipation of material increases, and thus overall fabrication costs increase.

Therefore, as shown in FIG. 10C, if liquid organic material is ejected when the protective layer 130 and the PDL 140 of an OH structure are formed, the liquid organic material is diffused into a space formed by the OH structure and the protective layer 130, and surface tension of the liquid organic material is decreased due to attraction force working between the space formed by the OH structure and the protective layer 130 and the liquid organic material. Therefore, planarity of the top surface of an organic layer may be improved with a relatively small ejection amount.

FIGS. 9, 1, and 2 show that the thickness H2 of the organic layer 151 corresponding to an HIL and an HTL is identical to the thickness H1 of the protective layer 130. Therefore, as shown in FIGS. 1 and 2, the light-emitting layer 152 formed on the organic layer 151 may be planarized.

Furthermore, as described above, since the thickness H2 of the organic layer 151 corresponding to an HIL and an HTL is identical to the thickness H1 of the protective layer 130, the overall thickness H3 of the intermediate layer 150 including the light-emitting layer 152 and the organic layers 151 and 153 becomes greater than the thickness H1 of the protective layer 130. If the PDL 140 is formed as an inorganic insulation layer, the thickness of the PDL 140 may become sufficiently small.

Figure 13:
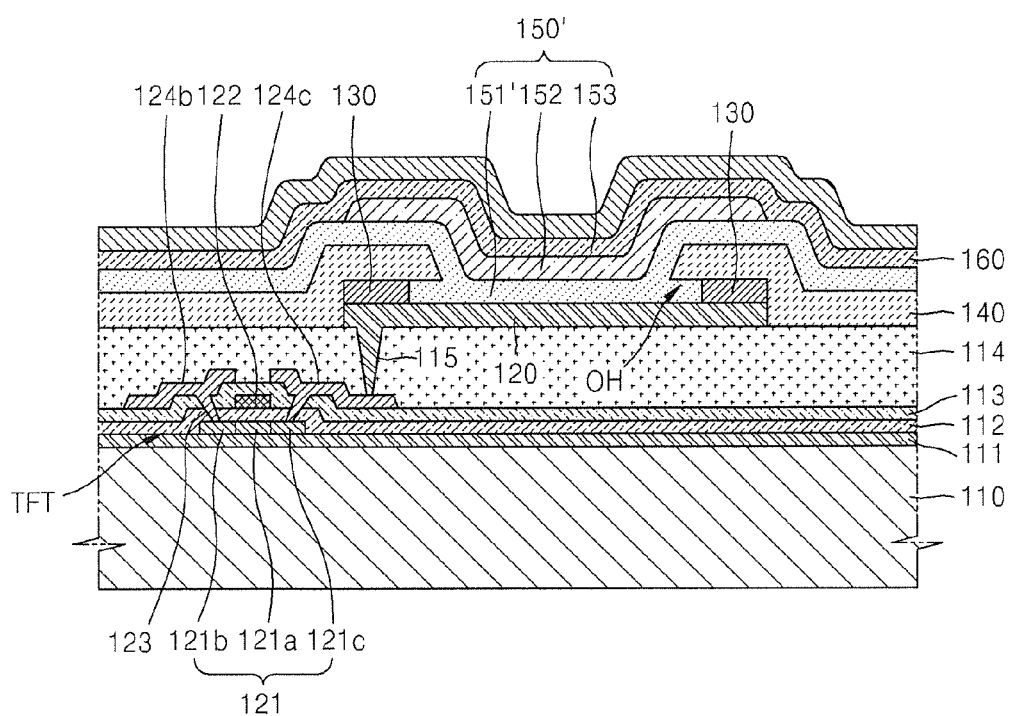
FIG. 13 is a sectional view of an organic light-emitting display device according to another embodiment of the present invention.

As shown in FIG. 13, the thickness H2 of the organic layer 151 may be greater than the thickness H1 of the protective layer 130. The liquid organic material is diffused into a space formed by the OH structure and the protective layer 130, and surface tension of the liquid organic material may be decreased due to attraction force working between the space formed by the OH structure and the protective layer 130 and the liquid organic material. Therefore, planarity of the top surface of the organic layer 151 may be improved with a relatively small ejection amount.

As described above, in an organic light-emitting display device according to the present embodiment, planarity of the bottom substrate may be improved by forming the PDL 140 as an inorganic insulation layer. Furthermore, according to the present embodiment, the pixel electrode 120 may be prevented from being damaged by using the protective layer 130 while the PDL 140 is deposited and dry-etched. Furthermore, planarity of an organic layer may be improved during operations, in which the organic layer is formed by ejecting liquid organic material, by respectively forming the protective layer 130 and the pixel electrode 120 of metals with different etching selectivities and wet-etching the PDL 140 to form an OH structure.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an organic light-emitting display device, the method comprising:
   (a) providing a substrate having at least one thin-film transistor (TFT);
   (b) sequentially forming a pixel electrode electrically coupling the TFT and a protective layer on the substrate;
   (c) forming a pixel defining layer (PDL) to surround an edge of the protective layer and to expose a portion of the protective layer by forming an insulation layer to cover the pixel electrode and the protective layer and patterning the insulation layer;
   (d) etching the protective layer to expose a portion of the pixel electrode, so that an overhang (OH) structure, in which the PDL protrudes more than the top surface of the protective layer, is formed; and
   (e) forming an intermediate layer by ejecting a light-emitting layer and at least one organic layer as liquid onto the exposed pixel electrode.

2. The method of claim 1, wherein, in operation (b), the thickness of the protective layer is at or between 100 Å and 1000 Å.

3. The method of claim 1, wherein, in operation (b), the protective layer comprises a metal having higher etching selectivity than the pixel electrode.

4. The method of claim 3, wherein the pixel electrode and the protective layer comprise transparent conductive oxides (TCOs).

5. The method of claim 4, wherein each of the pixel electrode and the protective layer comprises poly indium-tin-oxide (poly ITO), amorphous ITO (a-ITO), indium gallium oxide (IGO), or aluminum zinc oxide (AZO),
   the etching selectivities of which increase in the order stated, and
   the protective layer comprises a material having higher etching selectivity than the pixel electrode.

6. The method of claim 1, wherein, in operation (c), the PDL comprises an inorganic insulation layer.

7. The method of claim 6, wherein the PDL is formed through dry-etching.

8. The method of claim 7, wherein the PDL is etched by using plasma.

9. The method of claim 1, wherein, in operation (d), the protective layer is formed through wet-etching.

10. The method of claim 1, wherein, in operation (d), the protective layer is etched, such that the OH structure of the PDL protrudes to be at or between 0.2 μm and 5 μm from an edge of the protective layer.

11. The method of claim 1, wherein, in operation (e), the overall thickness of the intermediate layer is greater than the thickness of the protective layer.

12. The method of claim 1, wherein, in operation (e), at least one organic layer is formed between the light-emitting layer and the pixel electrode, and
   the overall thickness of the organic layer is identical to or greater than the thickness of the protective layer.

13. The method of claim 1, wherein, in operation (e), the intermediate layer is formed through inkjet printing or nozzle printing.

14. The method of claim 1, further comprising forming a counter electrode, which is a common electrode, on the intermediate layer after operation (e).

* * * * *